United States Patent
Thomas et al.

(10) Patent No.: US 10,905,025 B1
(45) Date of Patent: Jan. 26, 2021

(54) INTERCONNECTION MODULE AND SERVER RACK

(71) Applicant: Facebook, Inc., Menlo Park, CA (US)

(72) Inventors: Marquis Thomas, Union City, CA (US); Blanche Sydney Christina Chisholm, Redwood City, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/439,340

(22) Filed: Jun. 12, 2019

(51) Int. Cl.
*H05K 7/14* (2006.01)
*H04L 12/933* (2013.01)

(52) U.S. Cl.
CPC .......... *H05K 7/1491* (2013.01); *H04L 49/15* (2013.01); *H05K 7/1487* (2013.01)

(58) Field of Classification Search
CPC .. H05K 7/1429; H05K 7/1489; H05K 7/1491; H04Q 11/0005; H02H 9/008; H01R 29/00; H04L 49/15
USPC .......................................................... 439/43
See application file for complete search history.

(56) References Cited

U.S. PATENT DOCUMENTS

| | | | | |
|---|---|---|---|---|
| 6,111,738 A | * | 8/2000 | McGoogan | H02H 9/008 361/119 |
| 6,608,264 B1 | * | 8/2003 | Fouladpour | H01R 29/00 200/51.03 |
| 8,081,413 B2 | * | 12/2011 | Kothari | H02H 9/008 361/111 |
| 8,107,256 B1 | * | 1/2012 | Kondrat | H05K 7/1429 361/788 |
| 9,989,724 B2 | * | 6/2018 | Raza | G02B 6/4452 |
| 2001/0031046 A1 | * | 10/2001 | Troibner | H04Q 11/0428 379/202.01 |
| 2012/0023522 A1 | * | 1/2012 | Anderson | H04N 7/173 725/35 |
| 2015/0090895 A1 | * | 4/2015 | Koning | G03F 7/708 250/396 R |
| 2015/0215208 A1 | * | 7/2015 | Raza | H04L 45/64 370/400 |
| 2015/0279187 A1 | * | 10/2015 | Kranz | H04M 1/6041 340/539.12 |
| 2017/0127553 A1 | * | 5/2017 | White | H05K 7/1489 |
| 2017/0325009 A1 | * | 11/2017 | Mehrvar | H04Q 11/0005 |
| 2019/0385057 A1 | * | 12/2019 | Litichever | H04L 63/1416 |

* cited by examiner

*Primary Examiner* — Jean F Duverne
(74) *Attorney, Agent, or Firm* — Van Pelt, Yi & James LLP

(57) ABSTRACT

In an embodiment, a system includes a first group of connectors, a second group of connectors, and an interconnection enclosure. Each single connector in the first group provides an interface for a corresponding group of component signal paths. Each single connector in the second group provides an interface for at least one component signal path from each of the corresponding group of component signal paths of each connector in the first group of connectors. The enclosure houses at least a portion of the groups of component signal paths connecting the first group with the second group. The system is configured to provide an interconnection between network switches. In an embodiment, a system includes a network component rack and a panel coupled to the network component rack and configured to receive an interconnection module having the first group of connectors, second group of connectors, and an interconnection enclosure.

23 Claims, 16 Drawing Sheets

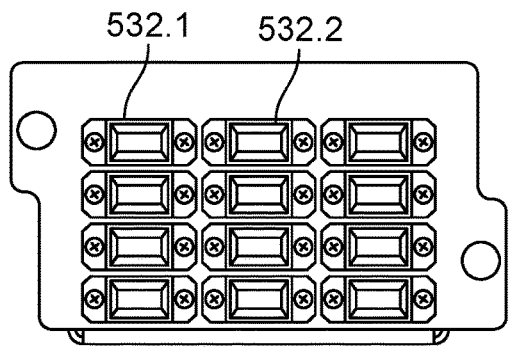
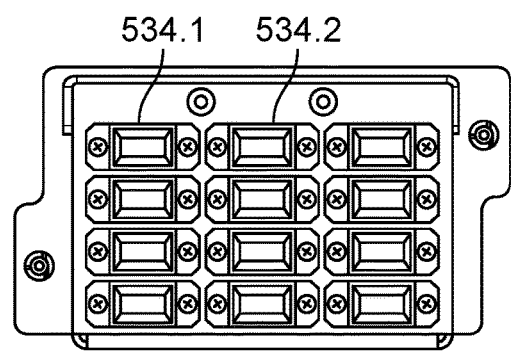
FIG. 5D  FIG. 5E
| Interconnection Module FRONT | | |
|---|---|---|
| MTO24 #1F | MTO24 #2F | MTO24 #3F |
| MTO24 #4F | MTO24 #5F | MTO24 #6F |
| MTO24 #7F | MTO24 #8F | MTO24 #9F |
| MTO24 #10F | MTO24 #11F | MTO24 #12F |
| Interconnection Module BACK | | |
|---|---|---|
| MTO24 #1B | MTO24 #2B | MTO24 #3B |
| MTO24 #4B | MTO24 #5B | MTO24 #6B |
| MTO24 #7B | MTO24 #8B | MTO24 #9B |
| MTO24 #10B | MTO24 #11B | MTO24 #12B |
FIG. 6A  FIG. 6B

INTERCONNECTION MODULE AND SERVER RACK

BACKGROUND OF THE INVENTION

Data centers house network infrastructure devices such as servers. Datacenters implement mesh networks that are made up of node interconnections in a web of connections. When a user visits a Web page, uses an application, or otherwise interacts with an Internet-based service, the user's requests are handled by data centers. Network infrastructure scales and evolves to adapt to application needs. As online streaming, virtual reality, and other data-heavy applications become more popular, mesh networks are increasing in complexity to meet the pace of the demand for a faster and more seamless user experience. The connections between nodes in a mesh network can be complex especially as the number of nodes and planes in the network increases. Challenges for data centers that make up a mesh network include is managing connection complexity and setting up racks making up the datacenter.

BRIEF DESCRIPTION OF THE DRAWINGS

Various embodiments of the invention are disclosed in the following detailed description and the accompanying drawings.

FIG. 5D is a front view of an interconnection module according to an embodiment of the present disclosure.

FIG. 5E is a back view of an interconnection module according to an embodiment of the present disclosure.

FIG. 6A is a diagram illustrating an embodiment of connectors on the front of an interconnection module.

FIG. 6B is a diagram illustrating an embodiment of connectors on the back of an interconnection module.

FIG. 7 shows an example chart mapping connector pin-outs of an interconnection module.

FIG. 9 shows an example of a cabling configuration for a group of switches using interconnection modules.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications, and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
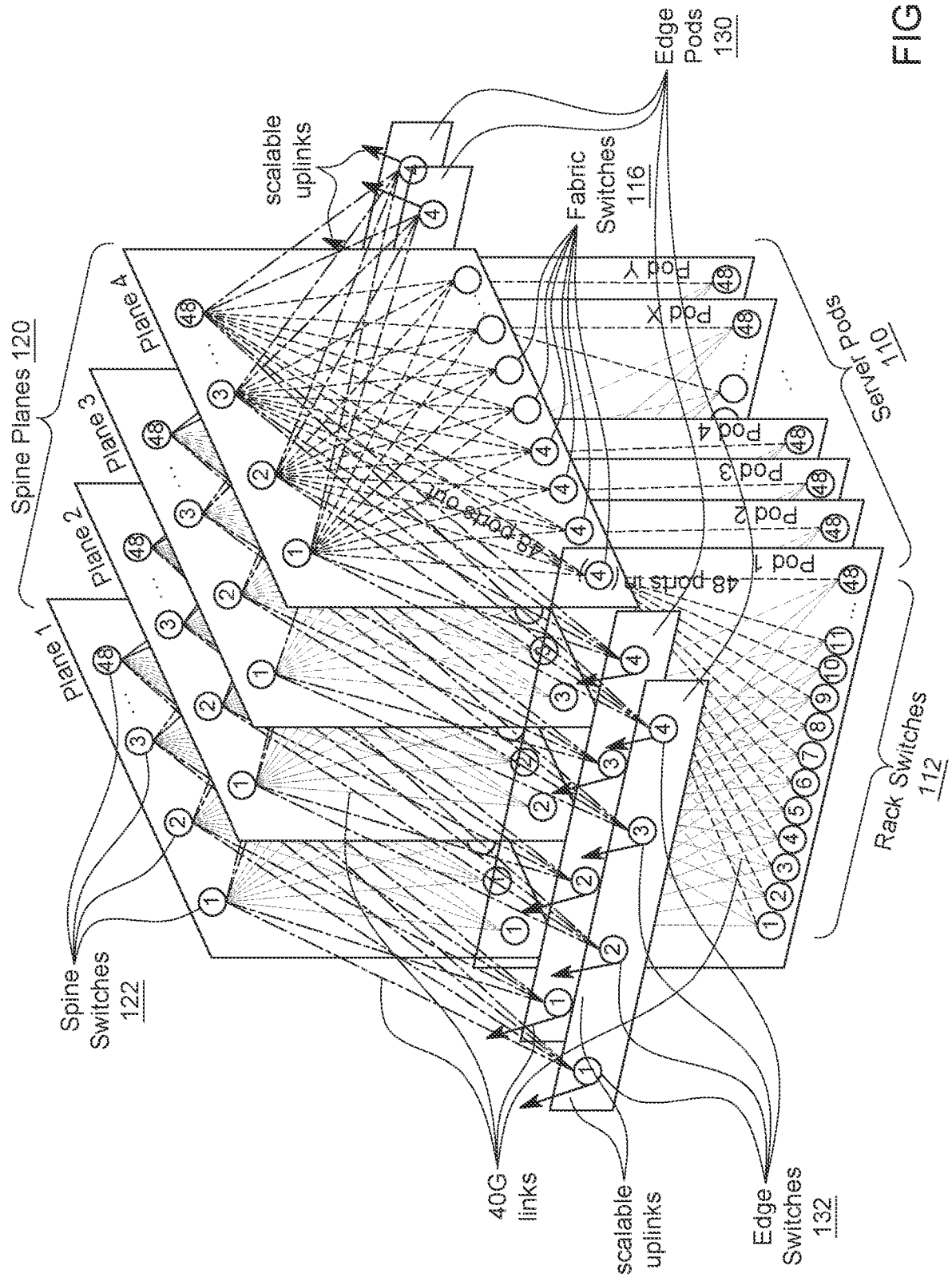
FIG. 1 shows an example of a mesh network in which an interconnection module and a server rack can be used.
Figure 2:
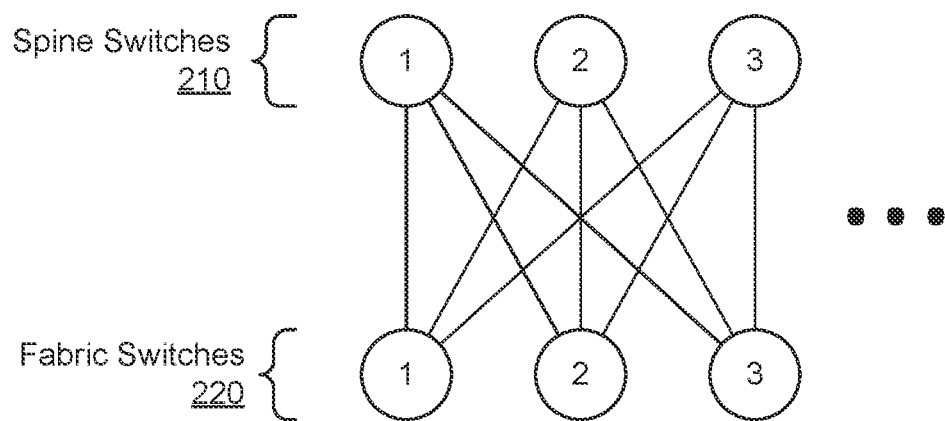
FIG. 2 shows an example of connections within a mesh network.
Figure 3:
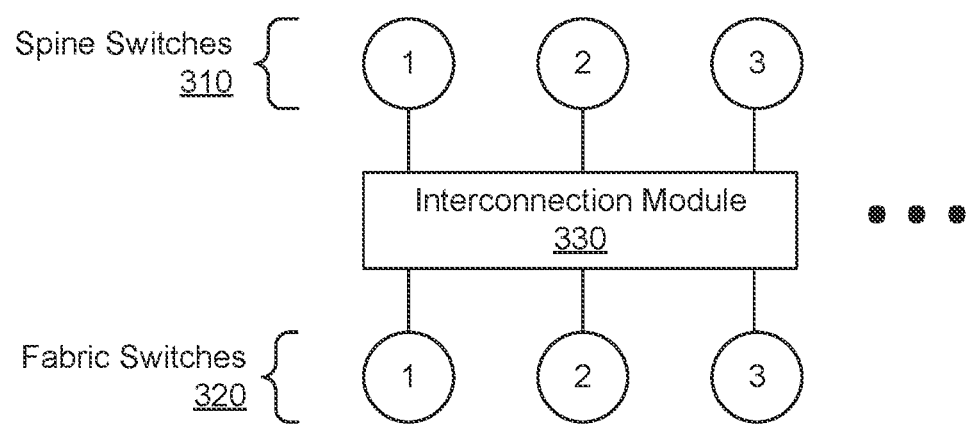
FIG. 3 shows an example of connections within a mesh network having an interconnection module.

Embodiments of an interconnection module and a server rack are disclosed. The interconnection module (sometimes called a fabric shuffle board) reorganizes connections between channels of a network cable thus reducing connection (e.g., cabling) complexity. The interconnection module can be included in a server rack (sometimes called a mobile core rack), which is a rack that may be easily moved around to provide additional flexibility for configuring a data center. First, embodiments of a data center topology and network fabric will be described (FIGS. 1-3). For example, an interconnection module or server rack can be used in such a data center to implement the network fabric. Next, embodiments of an interconnection module will be described (FIGS. 4-11). The interconnection module simplifies connections between nodes in a mesh network. Finally, embodiments of a server rack will be described (FIGS. 12-16). The server rack can be mobile and can facilitate the setup and maintenance of racks in a datacenter.

FIG. 1 shows an example of a mesh network in which an interconnection module and a server rack can be used. Unlike conventional data centers that use large devices and clusters connected together in a large mesh, the network here is disaggregated in the sense that smaller identical network units (e.g., server pods 110) are used and interconnected using various different network planes. The server pods are communicatively coupled to each other, e.g., by high-performance links.

In various embodiments, a server pod is a standard "unit of network," and functions as a logical switch. Each server pod includes fabric switches 116 and rack switches 112 (sometimes called top of rack or TOR switches). In this example, each pod is served by a set of four fabric switches for a 3+1 four-post architecture for server rack TOR uplinks, where each TOR has 4×40G uplinks, providing a total of 160G bandwidth capacity for a rack of 10G-connected servers. A server pod may be much smaller than a unit of network in a conventional data center, e.g., the server pod here has 24 server racks. This size may be advantageous because most basic mid-size switches can service the pods. A relatively smaller port density of fabric switches makes the internal architecture simple, modular, and robust. In some embodiments, for each downlink port to a TOR, an approximately equal amount of uplink capacity is reserved, allowing network performance to be scaled up to statistically non-blocking.

In FIG. 1, there are four spine planes 120, which are independent planes of spine switches 122. In this example, each spine plane is scalable up to 48 independent devices within the plane. Each fabric switch of each pod connects to each spine switch within its local plane. Together, the pods and planes form a modular network topology capable of accommodating hundreds of thousands of 10G-connected servers. The interconnection module disclosed here is configured to manage connections such as connections between fabric switches and spine switches. As shown one spine switch connects to multiple fabric switches, which can involve a high level of cabling complexity. As further described below, some configurations of datacenters involve even greater complexity. For example the Facebook® F16 fabric topology involves racks that each connect to 16 separate planes. The interconnection module organizes the connections to decrease the time it takes to setup a datacenter, easily service the datacenter, and reduce failover.

External connectivity (e.g., to an external network) is provided by edge pods 130, which has edge switches 132 that deliver data to the backbone and to back-end internal fabrics. For example, the edge pods can provide around 7.68 Tbps to the backbone and is callable to 100G and higher port speeds within the same device form factors. The network topology is scalable. In this regard, the number of fabric switches and rack switches can be increased or decreased to meet performance goals. Server pods can be added to provide more compute capacity, spine switches can be added for more intra-fabric network capacity, and edge pods or scale uplinks can be added for more extra-fabric connectivity.

The number, placement, and capacity of planes, switches, and links shown here are merely exemplary and not intended to be limiting. In this example four spine planes are shown. In another example, which is the Facebook® F16 data center fabric design, the system can be increased to four times the capacity (compared with the system in FIG. 1). Instead of using multichip-based planes with 400G link speeds described above, 16 single-chip-based planes with 100G link speeds are used. Each rack is connected to 16 separate planes. Using a network switch such as Facebook® Wedge 100S, the system has 1.6T uplink bandwidth capacity and 1.6T down capacity to the servers. The planes above the rack include sixteen 128-port 100G fabric switches (rather than four 128-port 400G fabric switches as described above). An example of the 128-port 100G fabric switch is Facebook® Minipack. In the F16 fabric topology the fabric edge pods 130 are replaced with direct connectivity between fabric spine switches and HGRID, which is an aggregation layer between buildings able to scale to many (e.g., six) buildings in the region each equipped with a full F16 fabric.

Figure 8:
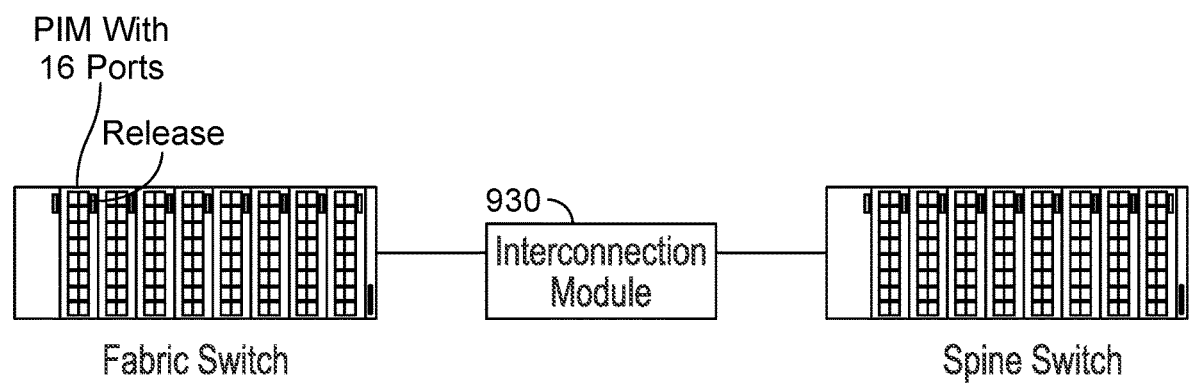
FIG. 8 shows an example of an interconnection module that is an interface between network switches.

A network switch such as a modular network switch (e.g., Facebook® Minipack) can play multiple roles in the data center (e.g., be used as a fabric switch, spine switch, aggregator, etc.). An example of a modular network switch network switch is shown in FIG. 8 (e.g., the fabric switch and the spine switch is each implemented using the modular network switch). The modular network switch has several port interface module (PIM) slots. A PIM provides switching operations such as receiving data packets and forwarding the data packets to the appropriate destination. The PIM allows processing units (e.g., CPUs, GPUs, or the like) to be easily repaired or replaced while other components of the network switch remain in place. A PIM supports a variety of card configurations such as Quad Small Form-factor Pluggable (QSFP), dense wavelength division multiplexing (DWDM), and the like. One type of interface module has 16 ports supporting 100G per port. Another type of interface module has 4 ports supporting 400G per port. Other configurations are also possible, such as 8×QSFP56 200G. In some embodiments, within a chassis, one or more types of network interfaces are used. A chassis may include all network interfaces of the same type or more than one type of network interface. The modular, replaceable nature of the network interfaces allow them to be easily replaced, removed, and mingled in the same chassis.

The examples below sometimes refer to the Facebook® Minipack as an example of a network switch but this is not intended to be limiting. The interconnection module and server rack can accommodate other types of network switches as well. The next figure shows an example of connections within a mesh network, specifically connections between spine switches (122) and fabric switches (116).

FIG. 2 shows an example of connections within a mesh network. For example, the shown fully connected mesh network includes groups of nodes, and each node in each group is communicatively coupled to every node in the other group. Here, three nodes, in spine switch group 210 are each coupled to three nodes in fabric switch group 220 by the nine connections shown. Nodes in spine switch group 210 represent some of the spine switches 122 in FIG. 1 and nodes in fabric switch group 220 represent some of the fabric switches 116 in FIG. 1. The spine switches and fabric switches are interconnected so that each spine switch is connected with each fabric switch. For example, spine switch 1 has a connection to fabric switch 1, another connection to fabric switch 2, and another connection to fabric switch 3. This example only shows the connections between three spine switches and three fabric switches totaling nine connections. Each connection is a signal path implemented by one or more cables (optical, copper, etc.) When there are many more switches, the connections can become complex. In addition, each connection may be made up of multiple fibers which further increases cabling complexity. An interconnection module can be introduced to the system to decrease cabling complexity.

FIG. 3 shows an example of connections within a mesh network having an interconnection module. The interconnection module simplifies physical connections required to establish a mesh network. For example, as compared to the web of connections required to fully interconnect the spine switches with the fabric switches of FIG. 2, the same fully connected mesh network can be established by having the nodes connect to interconnection module 330 rather than directly to each other. Internally, interconnection module 330 is configured to provide interconnection between nodes in a mesh network such as the one shown in FIG. 1. The interconnection module functions as an interface between spine switches 310 (e.g., spine switches 210 of FIG. 2) and fabric switches 320 (e.g., fabric switches 220 of FIG. 2 so that they do not directly connect to each other using a mesh of direct cables but rather connect through interconnection module 330 that internally connects the nodes together. The interconnection module allows each spine switch to communicate with each fabric switch via connections within interconnection module 330. As shown, spine switch 1 has a single cable connection to the interconnection module. The cable between each node (e.g., switch) and interconnection module 330 represents multiple channels. For example, the cable includes a plurality of channels corresponding to different individual wires or fibers can be bundled together as a single cable. The interconnection module then routes the different channels from spine switch 1 to each of the different fabric switches. This reduces the complexity of connections between the switches because instead of having nine separate cables, there are now six cables to establish the mesh network.

Here, the interconnection module is configured to provide interconnection between two different network levels of switches (e.g., spine switches and fabric switches). In other words, an example embodiment (system) includes a first group of network switches at a first layer of a mesh network and a second group of network switches at a second layer of the mesh network. An interconnection module such as interconnection module 330 is configured to couple the first group of network switches to the second group of network switches.

This example is not intended to be limiting. For example, the interconnection module can be configured to provide interconnection between other types of switches or network components. The number of connections received and routed by interconnection module 330 is merely illustrative and other numbers of connections may be routed in other embodiments.

Figure 4:
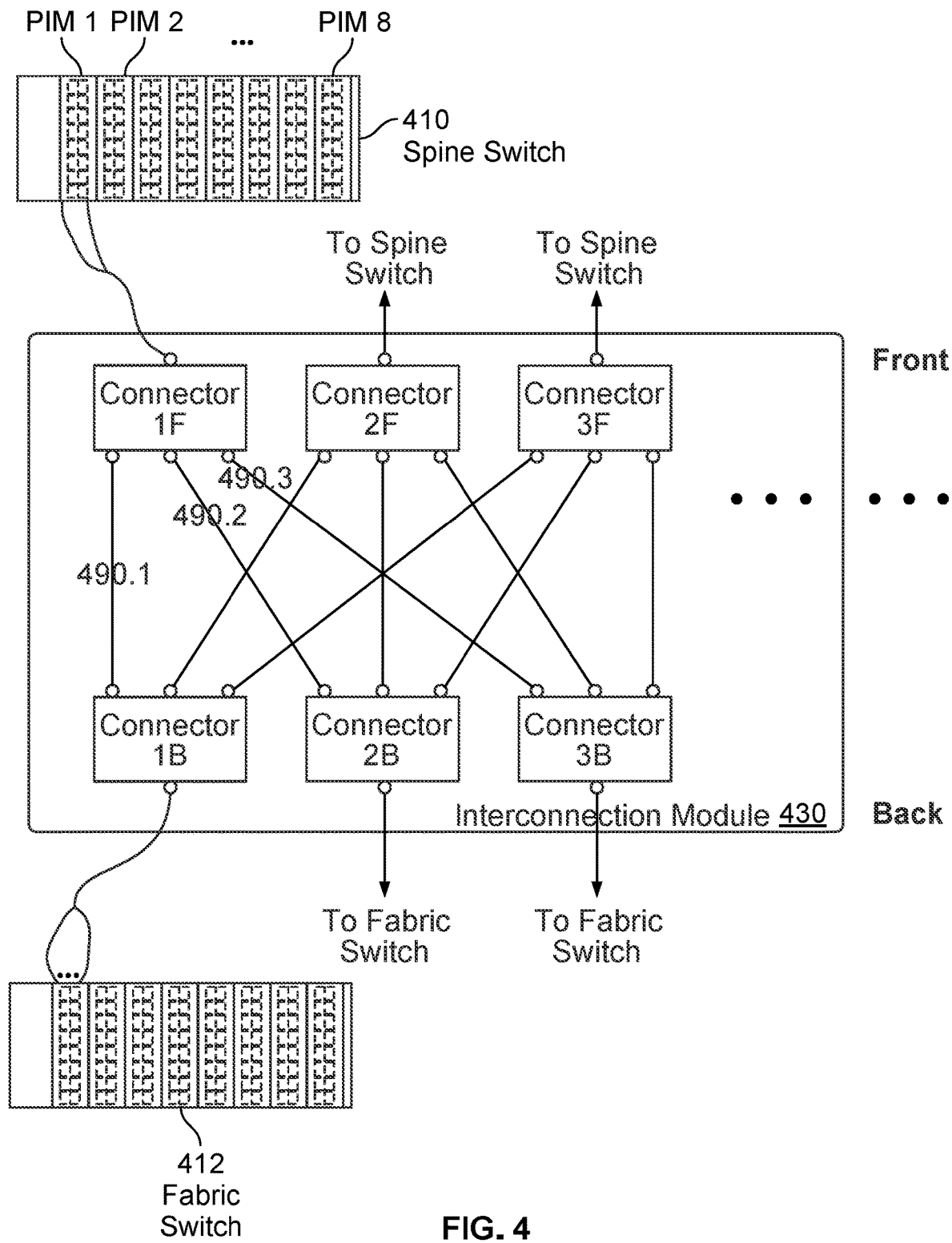
FIG. 4 is a block diagram illustrating an embodiment of an interconnection module.

FIG. 4 is a block diagram illustrating an embodiment of an interconnection module. Interconnection module 430 has two sides (e.g., a front and a back) where six connectors are located. The front connectors (Connectors 1F-3F) are collectively referred to as the first group and back connectors (Connectors 1B-3B) are collectively referred to as the second group.

Each connector of the interconnection module serves as an interface (e.g., as a receiving port) to a connector of an external cable (e.g., a cable from a network switch is connected to the connector of the interconnection module). The external cable includes a plurality of channels (e.g., a plurality of component wires/fibers included in the cable) and a receiving connector of the interconnection module provides a signal interface for these plurality of channels that are then internally separated out and routed to each different connector of a group of connectors.

Inside the interconnection module, there are individual channel signal paths that fan out and in between the connectors. Each single connector (e.g., Connector 1F is a first single connector, Connector 2F is a second single connector, etc.) in the first group provides an interface for a corresponding group of component channel signal paths to connectors in the second group. Each single connector (e.g., Connector 1B is a first signal connector, Connector 2B is a second single connector, etc.) in the second group provides an interface for component channel signal path(s) from each of the corresponding group of component signal channel paths of each connector in the second group of connectors to connectors in the first group. For example, channel signal path 490.1 connects Connector 1F and 1B, channel signal path 490.2 connects Connector 2F and 2B, and channel signal path 490.3 connects Connector 3F and 2B. In some embodiments, a single line connection between connectors represents a pair of physical connections (e.g., wire or fiber pair) that can be used to communicate in different directions, increase bandwidth, and/or provide fault tolerance.

The signal paths within the interconnection module 430 can be implemented in variety of ways. In some embodiments, wiring such as electrical or optical wires connect the front and back connectors to form the signal paths shown. In some embodiments, the signal paths are embedded on a flexible substrate such as an optical flex circuit. For example, fiber embedded on several stacked substrates connect endpoint to endpoint (the connectors) to form the signal paths shown.

The number of connectors shown are merely illustrative to simplify the diagram and illustrate the embodiment clearly. Other numbers of connections exist in various other embodiments. In an embodiment, there exists a group of 12 connectors on a front group and a group of 12 connectors on a back group with a fully connected mesh internal connection between the groups (e.g., each connector of the first group supports 12 component channel pair signal paths that each are routed to different connectors in the second group). For example, the front of the interconnection module connects to spine switches. Spine switch 410 corresponds to spine switch 1 of FIG. 3, the spine switch associated with Connector 2F corresponds to spine switch 2 of FIG. 3, and the spine switch associated with Connector 3F corresponds to spine switch 3 of FIG. 3. Similarly, the fabric switch associated with Connector 1B corresponds to fabric switch 1, the fabric switch associated with Connector 2B corresponds to fabric switch 2, and the fabric switch associated Connector 3B corresponds to fabric switch 3. For simplicity only one of the switches (spine switch 410) is shown. Each of the spine switches and fabric switches can be implemented by a network switch such as the modular network switch described with respect to FIGS. 1 and 8. Each modular network switch has 8 port interface modules (PIMs) and each PIM has 16 ports. The PIMs can provide redundancy, increased bandwidth, or be dedicated to difference uses such as uplink vs downlink. For purposes of illustration only one of the spine switches (spine switch 410) and only one of the fabric switches (fabric switch 412) are shown in detail. The other spine and fabric switches may have similarly connections. The signals of the spine switch PIMs can be exchanged with the signals of the fabric switch PIMs because the connectors are connected inside the interconnection module as shown.

Figure 10:
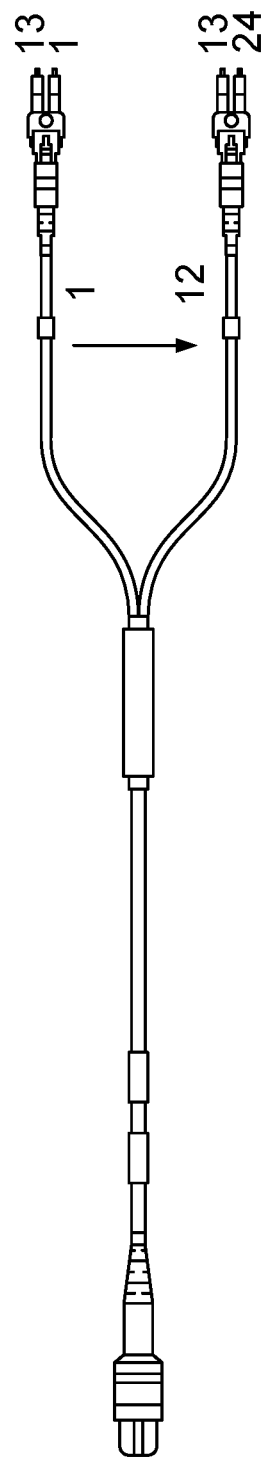
FIG. 10 shows an example of a breakout cable for an interconnection module.

In the example shown, Connector 1F is connected to a port interface module (PIM) of spine switch 410 using a breakout cable such as the one shown in FIG. 10. For example, one end of the cable (connected to the interconnect module) has a single cable connector supporting 12 channel pairs (e.g., 24 total individual channels) and the other end of the cable (connected to the switch) is physically broken out into 12 different channel pairs (e.g., with its own connector to a corresponding different port of a PIM of switch 410). Connector 1B is connected to a PIM of fabric switch 412 using a breakout cable such as the one shown in FIG. 10 (e.g., 12 different channel pairs with its own connector to a corresponding different port of a port interface module of switch 412). The shown switches have additional PIMs that provide redundancy between the switches being connected. Each additional PIM of a switch in a first group of switches can be used to establish an additional/redundant mesh network connection with a same second group of switches using another interconnection module. For example, an eight way redundancy can be established by having each of eight PIMs on a switch connect to a corresponding one of eight interconnection modules.

Figure 9:
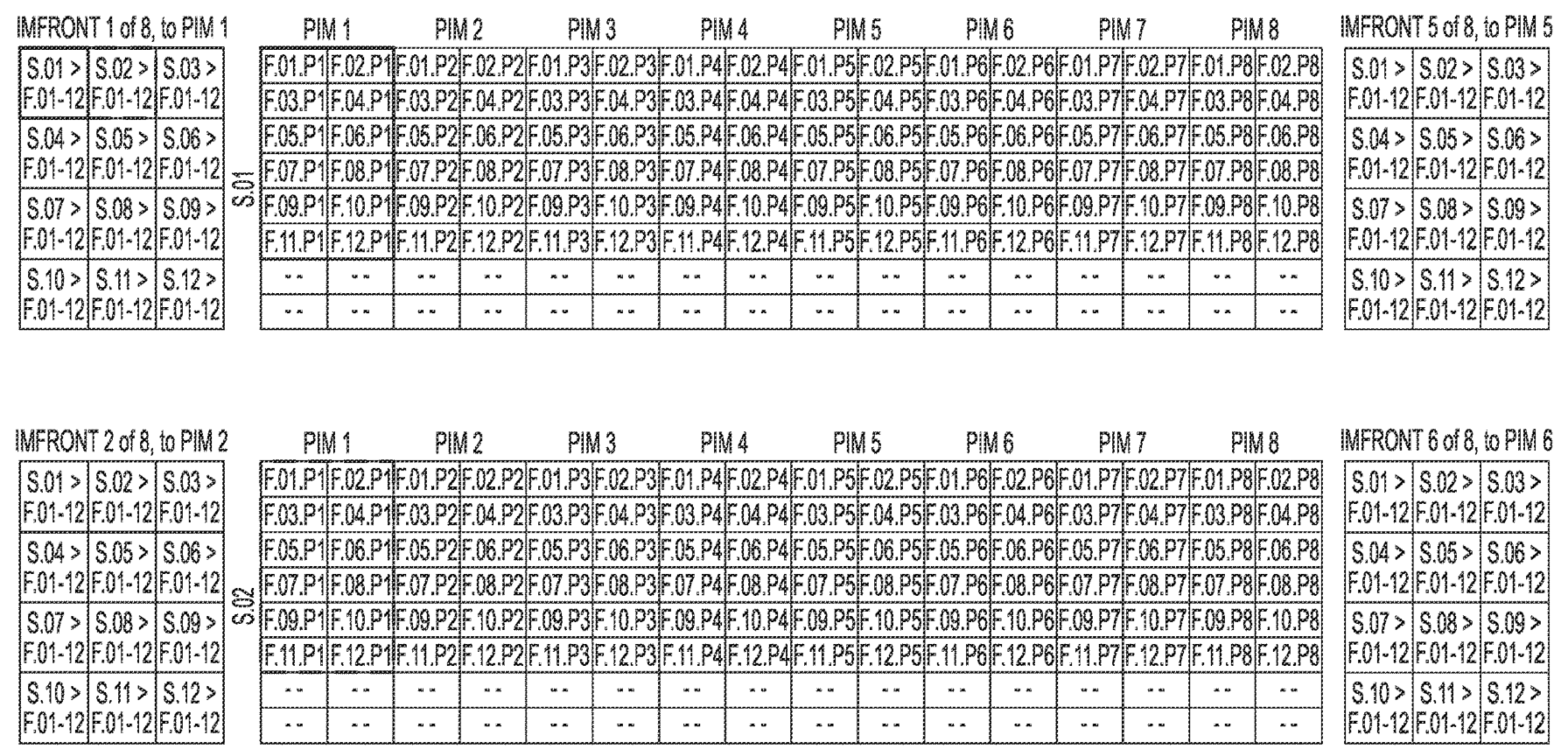
Figure 9:
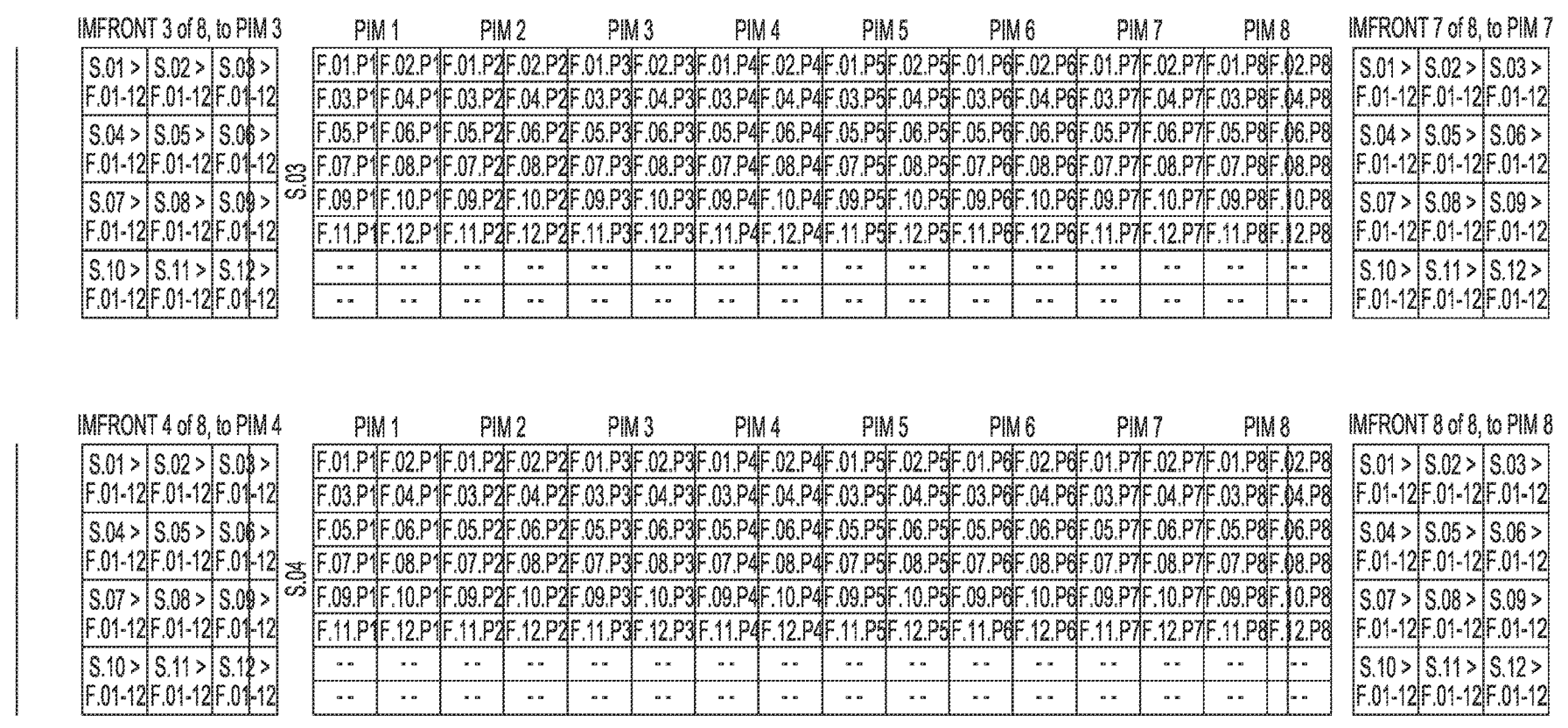

The connections shown in FIG. 4 are simplified. A line representing a single connection represents multiple channels in various embodiments. The number of connectors shown are merely illustrative to simplify to diagram and illustrate the embodiment clearly. Other numbers of connections exist in various other embodiments. In an embodiment, there exists a group of 12 connectors on a front group and a group of 12 connectors on a back group with a fully connected mesh internal connection between the groups (e.g., each connector of the first group supports 12 component channels that each are routed to different connectors in the second group). FIG. 9 shows an example of interconnection module connections to PIMs for a 12-connector interconnection module.

Figure 5A:
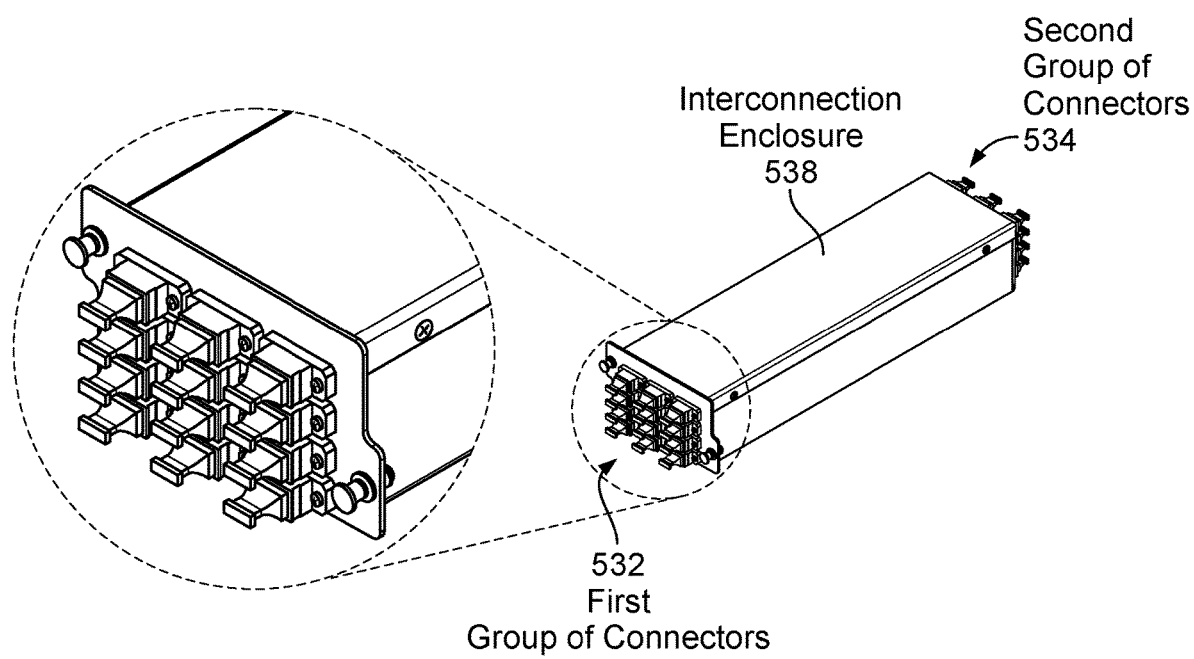
FIG. 5A is a diagram illustrating an embodiment of an interconnection module.

FIG. 5A is a diagram illustrating an embodiment of an interconnection module. The interconnection module system is configured to provide interconnection between network switches. The system includes a first group of connectors 532, a second group of connectors 534, and an interconnection enclosure 538. Each (single) connector in the first group of connectors 532 provides an interface for a corresponding group of component signal paths, and each (single) connector in the second group of connectors 534 provides an interface for at least one component signal path from each of the corresponding group of component signal paths of each connector in the first group of connectors as explained with respect to FIG. 4. The interconnection enclosure 538 is configured to house at least a portion of the group of component signal paths connecting the first group of connectors 532 and the second group of connectors 534.

Figure 5B:
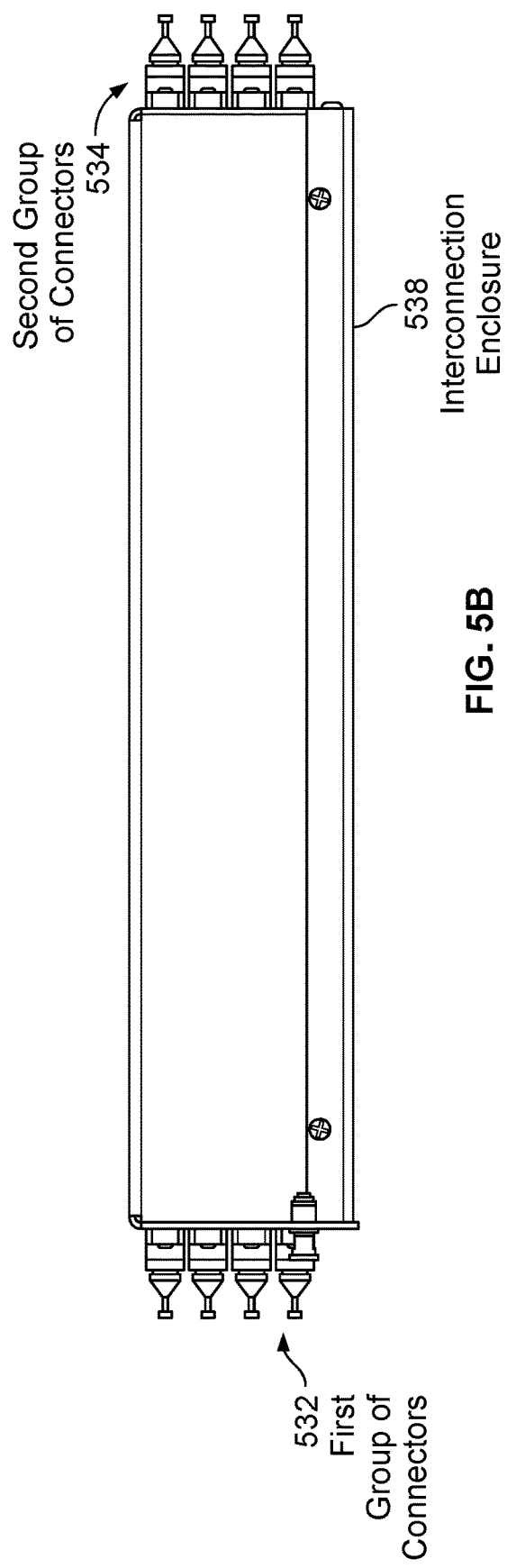
FIG. 5B is a side view of an interconnection module according to an embodiment of the present disclosure.
Figure 5C:
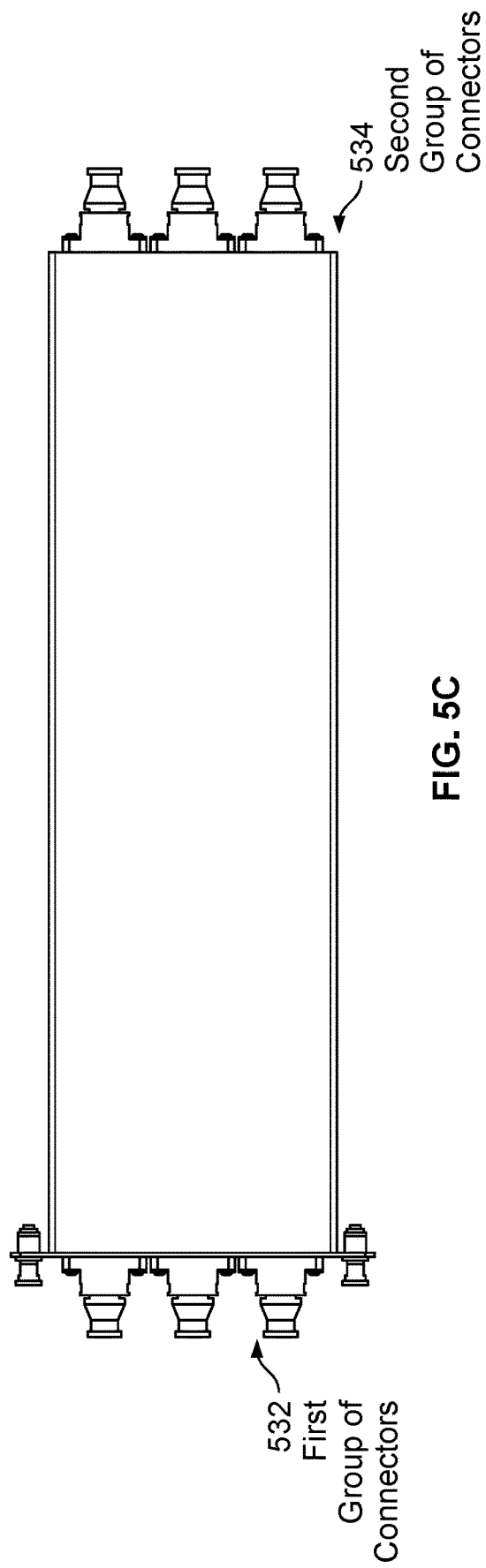
FIG. 5C is a top-down view of an interconnection module according to an embodiment of the present disclosure.

The left portion of FIG. 5A shows a close-up view of the first group of connectors 532. The connectors are arranged in four rows with three connectors in each row. FIG. 5B is a side view of an interconnection module according to an embodiment of the present disclosure. FIG. 5C is a top-down view of an interconnection module according to an embodiment of the present disclosure. The connectors can be modular units coupled together in an array by signal paths such as those discussed in FIG. 4. FIG. 5D is a front view of an interconnection module according to an embodiment of the present disclosure. FIG. 5E is a back view of an interconnection module according to an embodiment of the present disclosure. In various embodiments, the connectors are multi-fiber push-on/pull off (MPO) cables/connectors as further described with respect to FIGS. 6A and 6B. In this example, each group of connectors has 12 multi-fiber male connectors.

Although the examples discussed in this disclosure chiefly use optical fiber, the interconnection module can be configured to support a variety of signal path types. The interface provided by a connector can be optical or electrical. For example, to support optical connections, interface(s) provided by the first group of connectors includes an optical interface. Groups of component signal paths can be provided via optical fibers. To support electrical connections, interface(s) provided by the first group of connectors includes an electrical interface. Groups of component signal paths are provided via electrical conductors (e.g., copper wire).

In the context of a data center such as the one shown in FIG. 1, the front (first group of connectors 532) and back (second group of connectors 534) patches to various network devices to connect them. In various embodiments, the first group of connectors patches directly to 12 different fabric switches while the second group of connectors patches to 12 different spine switches.

Figure 11:
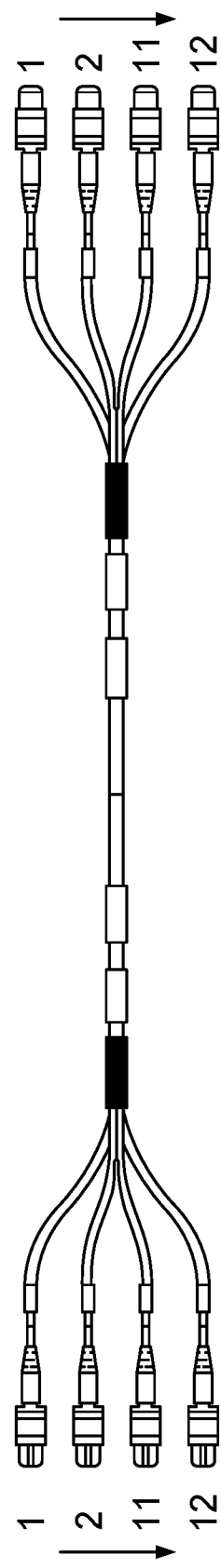
FIG. 11 shows an example of a breakout cable for an interconnection module.

FIG. 6A is a diagram illustrating an embodiment of connectors on the front of an interconnection module. The connectors correspond to the 12 connectors in the first group of connectors 532 shown in FIG. 5. Returning to FIG. 6A, each of the connectors is assigned an identifier. For example, MTO24 #1F represents a connector that accepts a cable connector supporting multiple channels such as a multi-fiber push-on/pull-off (MPO) cable/connectors in which there are 24 individual channel fibers (e.g., 12 fiber pairs). This means that this 12-connector interconnection module supports 288 individual fibers (144 fiber pairs) via the 12 connectors. Examples of multi-channel cables are shown in FIGS. 10 and 11. There are 11 other connectors like MTO24 #1F on the front of the interconnection module, so each of them is assigned a number 1F-12F to uniquely identify the connector.

FIG. 6B is a diagram illustrating an embodiment of connectors on the back of an interconnection module. The connectors correspond to the 12 connectors in the second group of connectors 534 shown in FIG. 5. Returning to FIG. 6A, each of the connectors is assigned an identifier. For example, much like the connectors shown and described in FIG. 6A, MTO24 #1B accepts a multi-fiber push-on/pull-off (MPO) cable/connectors in which there are 24 individual channel fibers (e.g., 12 fiber pairs). Every other connector of the 12 connectors shown in FIG. 6B also each supports 24 individual channel fibers (e.g., 12 fiber pairs). Internally the fronts and backs can be connected by signal paths described with respect to FIG. 4. A different pair of channels from each front connector (e.g., connectors #1F-12F shown in FIG. 6A) is internally routed to each back connector (#1B-12B). In other words, MTO24 #1F provides at least one channel pair to each of the back connectors on the back (#1B to #12B). Consequently MTO24 #1B provides an interface to a channel pair of each front connector (e.g., connectors #1F-12F shown in FIG. 6A). The next figure shows a detailed example chart of how each of the different 24 channels of the 12 connectors are internally routed.

Figure 7:
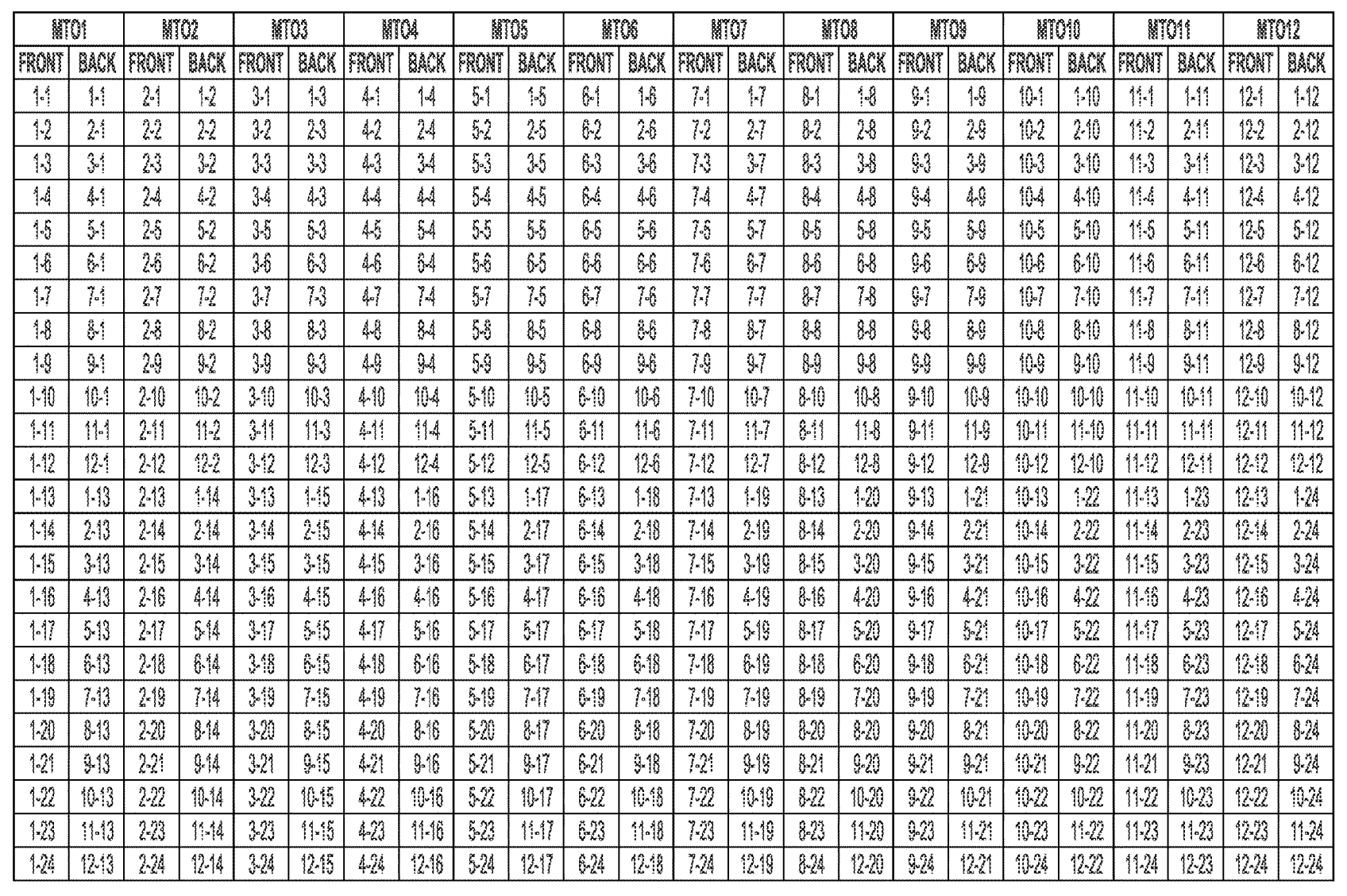

FIG. 7 shows an example chart mapping connector pinouts of an interconnection module. This shows an example of how the individual channels of the connectors in FIGS. 6A and 6B can be internally routed. Each connector is a multi-channel connector having 24 channels numbered 1 to 24.

For example, each of the 12 optical fiber connectors is identified by an MTO number: MTO1 is the first optical fiber connector, MTO2 is the second optical fiber connector, etc. Each optical fiber connector has a front and back as indicated by the columns. Each cell indicates a channel identifier. Referring to FIG. 7, the MTO1 columns correspond to a first connector: there is a front column (e.g., corresponding to MTO #1F of FIG. 6A) and a back column (e.g., corresponding to MTO #1B of FIG. 6B). The front column corresponds to a connector in the front of the interconnection module and the back column corresponds to a connector in the back of the interconnection module.

Referring to FIGS. 5D and 5E, connector 532.1 corresponds to column MTO1 front (of FIG. 7) and connector 534.1 corresponds to column MTO1 back. Connector 532.2 corresponds to column MTO2 front and connector 534.2 corresponds to column MTO2 back, and so on until all 12 connectors have been covered by the table shown in FIG. 7. Similarly, referring to FIGS. 6A and 6B, MTO24 #1F MTO1 front (of FIG. 7) and MTO24 #1B MTO1 back.

In each cell of FIG. 7, there is a pair of numbers identified with reference to the front connectors of an interconnection module. The number to the left of the hyphen is the front connector (MTO) identifier number, and the number to the right of the hyphen is the channel identifier number of that MTO. For example, "1-1" means the first channel of front connector MTO1 and "1-2" means the second channel of front MTO1. There are 24 channels interfaced on the front of MTO1 and 24 channels interfaced on the back connector MTO1. All of the channel identifiers identified for the "FRONT" column of MTO1 for the front connector MTO1 is referenced with respect to the front connector MTO1, while the channel identifiers identified for the "BACK" column for the back connector MTO1 is referenced with respect to the front connector MTO1.

Referring to MTO1 back column, 1-1 identifies the internal connection to the first channel of front connector MTO1, 2-1 identifies the internal connection to the first channel of front connector MTO2, 3-1 identifies the internal connection to the first channel of front connector MTO3, and so on. 1-13 is the thirteenth channel from MTO1, 2-13 is the thirteenth channel from MTO2, 3-13 is the thirteenth channel of front connector MTO3, and so on. As shown in the chart, a pair of two channels connect to the same two front and back connectors. In this way each of the pinouts interfacing the channels of the 12 front connectors is connected the pinouts interfacing the channels of the 12 back connectors via internal channel pair signal paths between the connectors.

Figure 13:
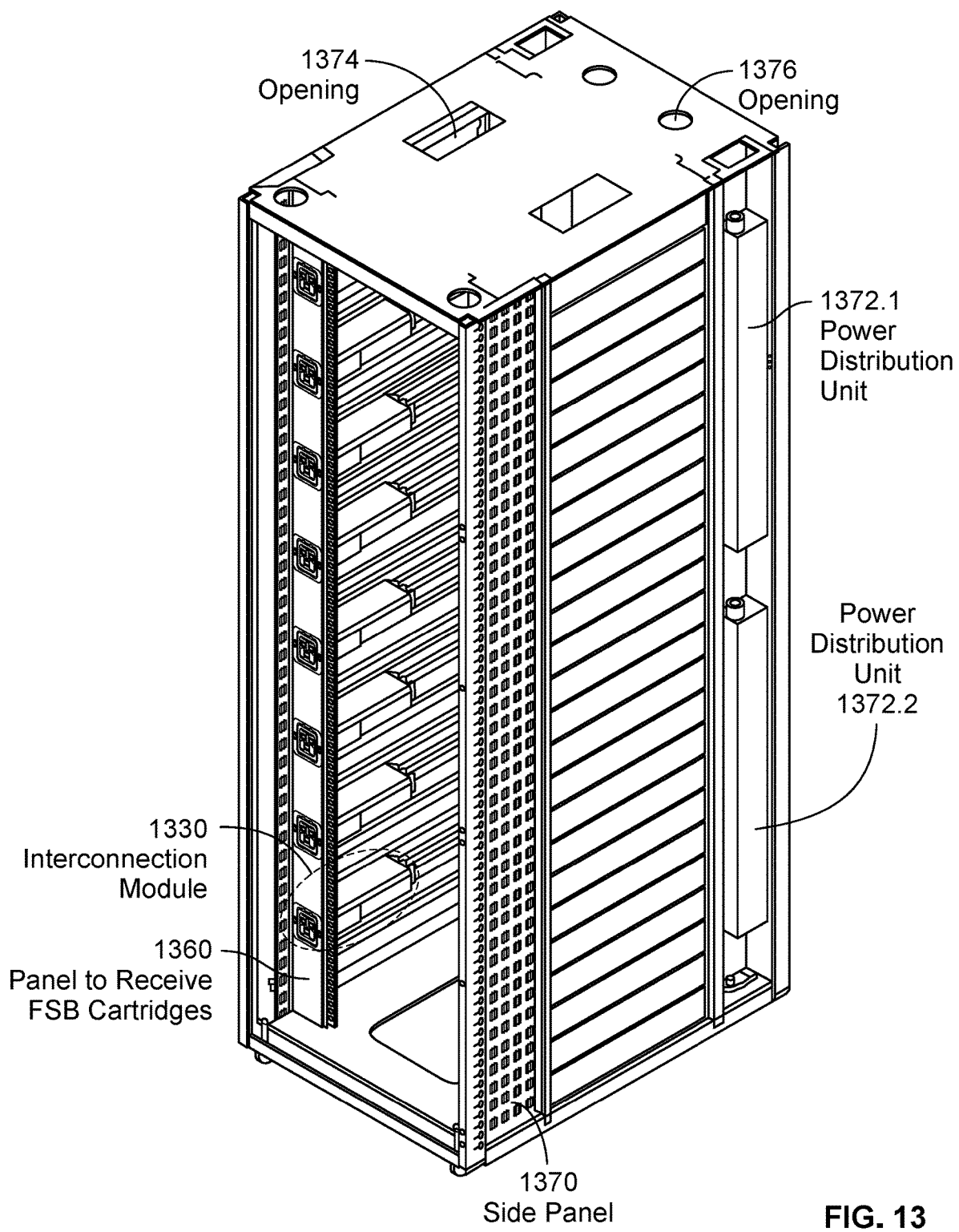
FIG. 13 is a diagram illustrating an embodiment of a server rack.

Having a pair of channels for each signal path can provide redundancy, added transmission capacity, having one for uplink and one for downlink, among other benefits. The number of optical channels (here 24) per connector is merely exemplary and not intended to be limiting. Connectors can be connected using a variety of breakout cables examples of which are shown in FIGS. 10 and 11. The interconnection module finds application in a variety of networking applications including as an interface between network switches embodied in a Facebook® Minipack (FIG. 8) and between other server rack components (FIG. 13).

FIG. 8 shows an example of an interconnection module that is an interface between network switches. More specifically, in this example, interconnection module 930 is an interface between a fabric switch embodied in a modular network switch (e.g., Facebook® Minipack) and a spine switch embodied in a modular network switch (e.g., Facebook® Minipack). An example of the modular network switch is further described with respect to FIG. 1. Each of the modular network switches includes eight PIMs, and each PIM has 16 ports. As further described with respect to FIG. 1, a PIM supports a variety of card configurations such as Quad Small Form-factor Pluggable (QSFP), dense wavelength division multiplexing (DWDM), and the like.

Typically each spine switch is connected to each fabric switch. Without the interconnection module 930, the cabling complexity between the fabric and spine switches can be complex and thus hard to assemble/configure and also has higher failover rates. The interconnection module can be provided between the fabric and spine switches to manage connections between the switches and reduce cabling complexity. In various embodiments, the front of the interconnection module (e.g., first group of connectors) patches to PIMs of the spine modular network switch. The next figure shows an example of a spine switch inner rack patch sequence.

FIG. 9 shows an example of a cabling configuration for a group of switches using interconnection modules. This is an example of connecting together 12 spine switches with 12 fabric switches with 8 times redundancy using 8 PIMs per switch and 8 interconnection modules. The figure shows eight interconnection modules (IM Front 1 of 8 through 8 of 8) and four spine network switches (S.01 through S.04). Each network switch is a spine switch has eight PIM slots, labeled PIM 1 through PIM 8. Each PIM has 16 ports arranged in two columns. The PIMs provide redundancy and increased bandwidth. The other 8 of 12 spine switches are not shown to simplify the illustration but are a part of this example.

Each interconnection module (IM) is connected to a different PIM of each spine switch. As shown, the front of each interconnection module has 12 connectors. In each box corresponding to a connector, the spine switch to fabric switch correspondence is indicated. Referring to "IM Front 1 of 8, to PIM 1," S.01>F.01-12 means spine switch 1 (S.01) is connected to this front connector and different channel pairs carried by this connector will be routed to corresponding different fabric switches 1 through 12 (F.01-12). Thus via a signal cable from spine switch 1 to this connector on the IM, one spine switch is connected to 12 different fabric switches. "IM Front 2 of 8" references a second interconnection module that is connected to PIM 2 of the spine switches. Thus by using 8 PIMs and 8 interconnection modules, an 8 way redundant mesh network is achieved. The boxes for the shown spine switches (S.01-S.04) represent ports of the spine switches (showing 16 ports per 8 PIMs per spine switch). The identifier inside each box represents the spine switch port (corresponding to a channel pair) and identifies the destination port (also corresponding to a channel pair) of the fabric switch to be connected to the spine switch port. For example, for "F.01.P1", the "F" denotes the "fabric switch", the "01" denotes the fabric switch identifier number, and the "P1" denotes the port number of the identified fabric switch. Only 12 of 16 ports of the PIM are used in this example, but other examples may utilize other numbers of ports.

A variety of cables can be used to form the signal paths within an interconnection module and to connect the interconnection module to other server components. The connections can be made using the example cables shown in FIG. 10. For example, the single end of cable shown in FIG. 10 plugs into the IM connector corresponding to the bolded top left box and the fan out connectors plug into the corresponding different ports of a PIM in spine switch 1 (here the bolded first two columns of S.01). Further, the single end of another instance of the cable shown in FIG. 10 plugs into the IM connector corresponding to the dashed top center box and the fan out connectors plug into the corresponding different ports of a PIM in spine switch 2 (here the dashed first two columns of S.02).

FIG. 10 shows an example of a breakout cable for an interconnection module. The left end connector of the cable provides an interface for 12 different component channel pairs (24 fiber interfaces total). These 12 different component channel pairs breaks out into 12 different connectors on the right side. Only the first and last are shown in the diagram, but 12 breakout connectors exist. Each of the 12 connectors provide an interface for two individual channels (e.g., wires/fibers).

FIG. 11 shows an example of a breakout cable for an interconnection module. This cable may be used to bundle together the individual component cables connecting to connectors of interconnection modules to enable for a more organized cable management and routing. For example, each interconnection module has 12 back connectors to be connected to switches located in another part of a data center. Having a separate cable for each individual back connector results in a large number of cables to be organized and routed, especially when multiple interconnection modules are to be utilized. The cable shown in FIG. 12 bundles together 12 of these individual cables into a single cable and includes 12 breakout ends on both left and right sides of the cable. Only four breakouts are shown on each side of the cable in the diagram, but 12 breakouts exist on each side of the cable. Each breakout of at least one side of the cable is terminated by a cable connector (e.g., providing an interface for 24 fibers) that can be connected to a connector of an interconnection module. In some embodiments, each breakout of at least one side of the cable is terminated by a cable connector (e.g., providing an interface for 24 fibers) that can be connected to the left end of an instance of the cable shown in FIG. 10.

Figure 12:
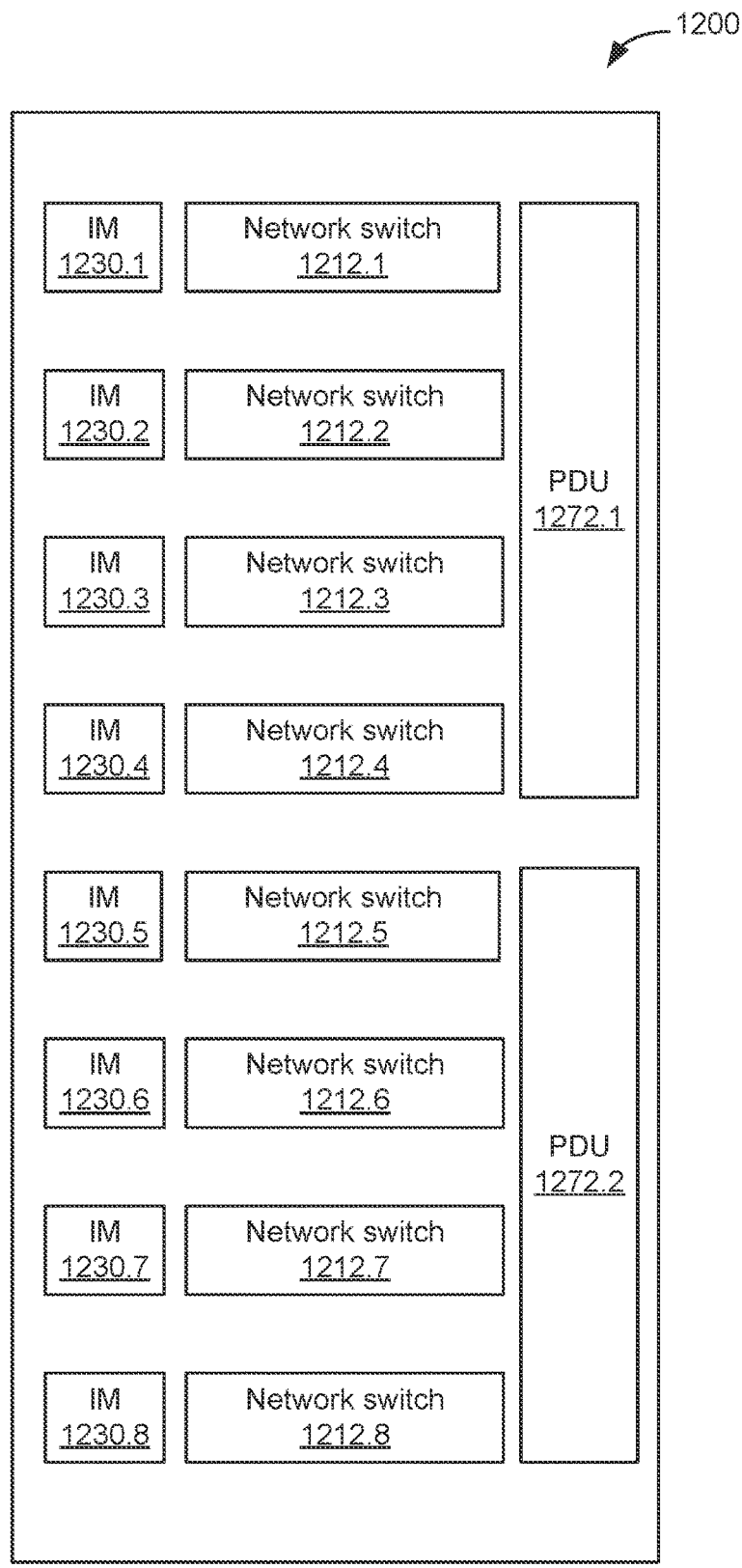
FIG. 12 is a block diagram illustrating an embodiment of a server rack in which an interconnection module is included.

FIG. 12 is a block diagram illustrating an embodiment of a server rack in which an interconnection module is included. This example shows a single rack column. In various embodiments, rack columns may be grouped into several (e.g., three rack columns), and the group of rack columns may share one or more components.

The system shown here includes a network component rack (server rack) and a panel coupled to the network component rack and configured to receive an interconnection module such as the ones described above. Rack column 1200 includes power distribution units 1272.1 and 1272.2, computer network switches 1212.1-1212.8, and interconnection modules 1230.1-1230.8. The number and placement of components are merely exemplary and not intended to be limiting.

Power input equipment, e.g., a top power rail can take up 1 OU to 3 OU of space in the rack column 1200. Three-phase AC power is delivered to the power distribution units 1272.1 and 1272.2. The power distribution units are configured to provide power to the server components by converting the input power into a voltage suitable for the server components. In various embodiments, power distribution unit 1272.1 powers rack-mounted components (interconnection modules 1230.1-1230.4 and network switches 1212.1-1212.4) in the top half of the server rack and power distribution unit 1272.2 powers rack-mounted components (interconnection modules 1230.5-1230.8 and network switches 1212.5-1212.8) in the top half.

In various embodiments (not shown) instead of (or in addition) to the power distribution unit, power is delivered by a bus bar running through the rack and a power shelf. For example, a rack column includes power shelves (not shown) that in turn have power supply units and battery backup units. In various embodiments, the power supply unit is configured to communicate with and manage one or more corresponding battery backup units. For example, a power supply unit can instruct a battery backup unit to charge or discharge. The power supply unit can send messages to a network switch regarding the power supply unit itself or the battery backup unit associated with the power supply unit. Each power supply unit may include a power supply circuit. When there is an AC outage, the power supply unit will use the power from the battery backup unit and convert it to the DC voltage, e.g., 12.5V, used by the components serviced by the power shelf.

In some embodiments, a separation bar (not shown) isolates regions within the rack column. For example, a top half of the rack column can be separated from a bottom half of the rack column by the separation bar. For example, a first power zone provides 18 OUs of space, including 8 OUs of space above the power shelf, 8 OU of space below the power shelf, and 2 OU of space taken up by the power shelf 1204. The two power zones can be separated by a separation bar 1210 that takes up 0.5 OU of space. The separation bar can serve as a stabilizer and a calibrator. For example, the separation bar can be 339 mm long. DC bus bar can be coupled to the power input equipment and the power shelf, to deliver power from the top power rail to the power shelf.

A power distribution unit can establish its own power zone. For example, power distribution unit 1272.1 can provide power to the first power zone via a DC bus bar. One or more DC bus bars can be coupled in parallel to the power supply circuits of the PSUs. The DC bus bars can bundle two wires (positive and negative terminations, with negative chassis pre-mating bus bar) providing a DC differential voltage (e.g., 12.5V). In some embodiments, there may be a provision to connect the power zones in the rear of the rack making up one power zone. In this case, only one power distribution unit would be used per rack column for a low-power implementation.

The network switches 1212.1-1212.8 provide server functionalities such as servicing requests and supporting applications and services. An example of a network switch is a modular network switch (e.g., Facebook® Minipack) further described with respect to FIG. 1. Components such as the network switch can be easily modified and replaced according to networking needs and when new technology becomes available.

Interconnection modules 1230.1-1230.8 are configured to be communicatively coupled to the network switches 1212.1 to reducing the cabling complexity within and between server racks. Examples of how interconnection modules can be connected to network switches is described above (e.g., FIGS. 8 and 9).

The rack column 1200 may be implemented in accordance with the Open Compute Project standard (Open Rack V2) having a rack height of around 87 inches or 42 open rack units. In the Open Compute Project standard, an open rack unit or "OU" is a unit for the height of a chassis mounted in the rack. 1 OU is 48 mm high. For example, power shelf 1204 can occupy 3 OU of space.

Figure 14:
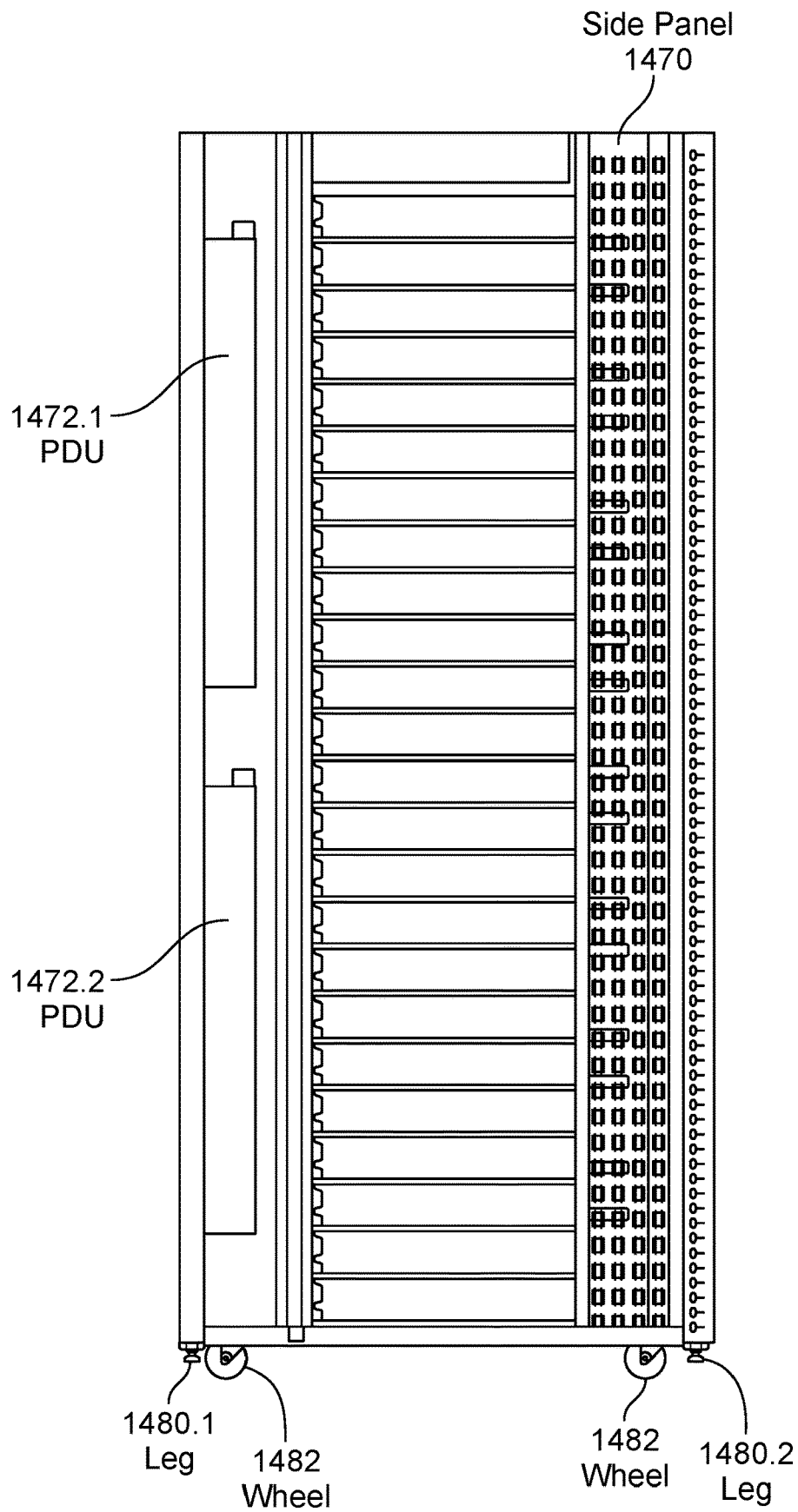
FIG. 14 is a left side view of a server rack according to an embodiment of the present disclosure.

FIG. 13 is a diagram illustrating an embodiment of a server rack. In this example, the rack is rectangular in shape with a top having openings 1374 and 1376, a bottom, a left side, a right side, and a back. The front can be open as shown to allow components to be inserted into and removed from the rack. The rack shown here is mobile because it can be easily moved around. In various embodiments, the rack includes wheel(s) coupled to a bottom of the rack such as the example as shown in FIG. 14 to allow the rack to be rolled around.

In various embodiments the rack system includes a panel 1360 to receive one or more interconnection modules and at least one wheel for mobility. An interconnection module such as the one described above is configured to be mounted within a network component rack such as on a side panel adjacent to a network switch. Panel 1360 includes an opening for vertically arrange interconnection modules. An example of an interconnection module is shown in FIG. 5.

Figure 16:
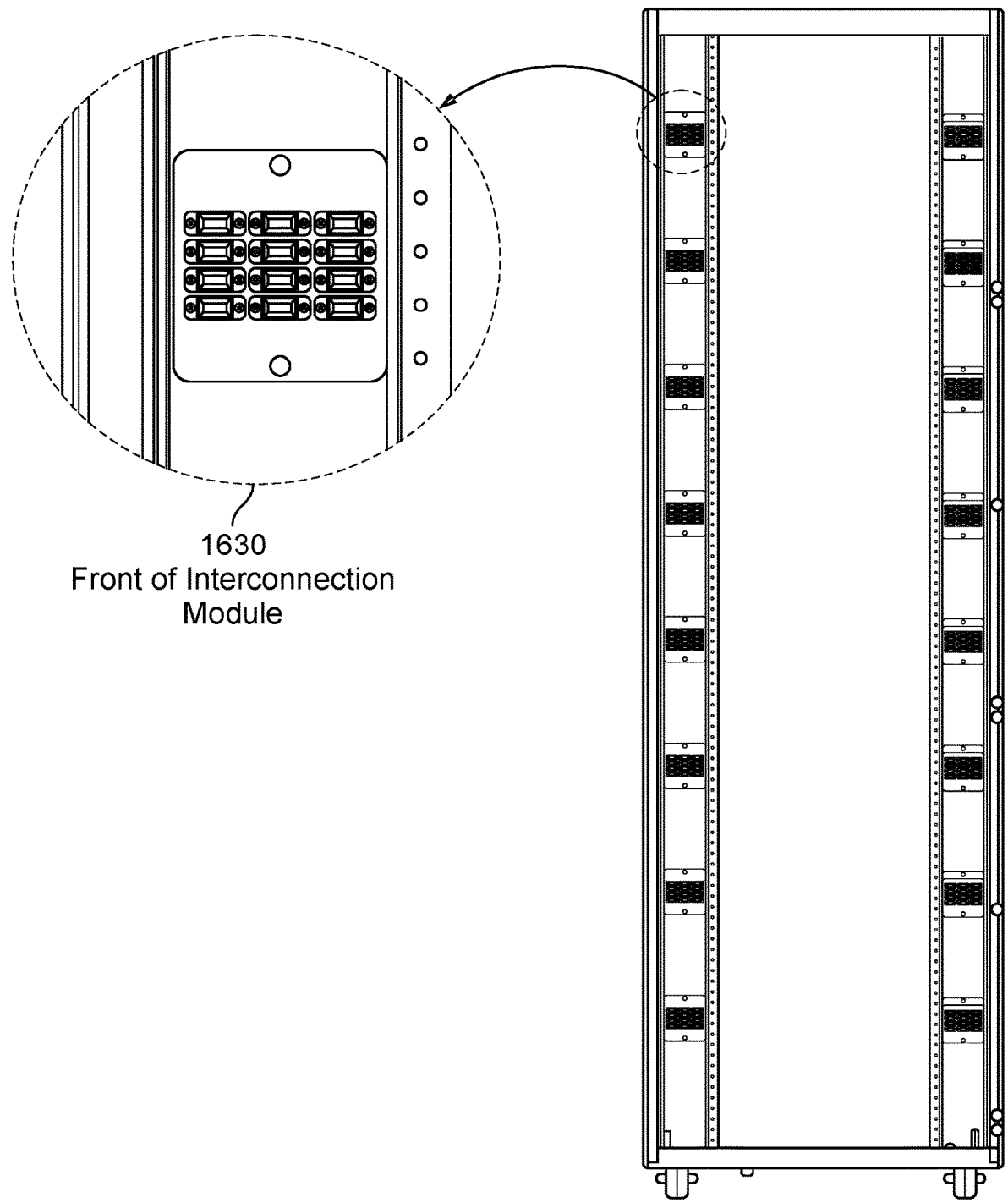
FIG. 16 is a front view of a server rack according to an embodiment of the present disclosure.

In the example shown in FIG. 13, panel 1360 runs along in the front of the rack along the left side. There are eight interconnection modules 1330 installed in this rack and the front connectors of the interconnection modules are visible. The interconnection modules can be connected to rack components such as network switches to mesh the fabric topology of fabric switches with spine switches to simplify cabling as described above. The network switches are not pictured in this figure to more clearly illustrate panel 1360 with the fabric shuffle cartridges 1330. In various embodiments, an interconnection module such as the one described above is configured to be mounted on the rack vertically on two sides next to a network switch as shown in FIG. 16.

Returning to FIG. 13, side panel 1370, which runs along the right side of the rack in this example, is configured to hold and organize cables. For example, cables can be dressed out from the openings and strapped to the side. In various embodiments, side panel can include cable support bar(s) configured to support cabling.

The top of the rack includes openings 1374 and 1376 for cabling. The number and placement of the openings are merely exemplary and not intended to be limiting. They can be located at appropriate places depending on where cables are expected to be run through the rack. In this example, opening 1374 is a cutout to receive cabling that patches to the backs on interconnection modules 1330. Referring to FIG. 5A, cables from the second group of connectors 534 can be run through opening 1374 of FIG. 13. Returning to FIG. 13, opening 1376 is a cutout to receive cabling for the power distribution units 1372.1 and 1372.2.

The number and placement of power distribution units is merely exemplary and not intended to be limiting. In some embodiments, each rack has four power distribution units (two of which are shown). The power distribution unit is configured to deliver power to components of the rack and examples are further described with respect to FIG. 12.

In various embodiments, the rack is a four post rack having dimensions of around 30 in×42-46 in×96.67 in tall, which is approximately 51 RUs tall. The rack can replace conventional systems such as racks that are 21 in wide×42 to 46 in deep×96 in tall with a vertical cable manager measuring 10 in×96 in.

FIG. 14 is a left side view of a server rack according to an embodiment of the present disclosure. Each of the components are like their counterparts in FIG. 13. As shown, there are two power distribution units 1472.1 and 1472.2 provided towards the back of the rack. A side panel 1470 towards the front of the rack is configured to organize cables by allowing cables to be passed through the openings of the side panel and strapped down.

The rack is mobile because it can be moved on wheels 1482.1 and 1482.2. In various embodiments, there is a wheel (caster) near each corner of the bottom of the rack so there is a total of four wheels allowing the rack to be steered and translated to a desired location. In various embodiments, adjacent racks can be connected to each other. For example adjacent racks are mounted/bolted to each other to prevent unintentional movement.

Legs 1480.1 and 1480.2 are configured to stabilize and secure the rack. For example, the rack can be locked into place using legs 1480.1 and 1480.2. For example, the legs are configured to descend to secure the system from moving. The system can move due to the wheel(s) as described above. The leg can be lowered lower than the wheels so that the wheels do not contact the ground and the rack is locked into the place. Other mechanisms to lock the wheels and prevent the racks from moving can be used.

Figure 15:
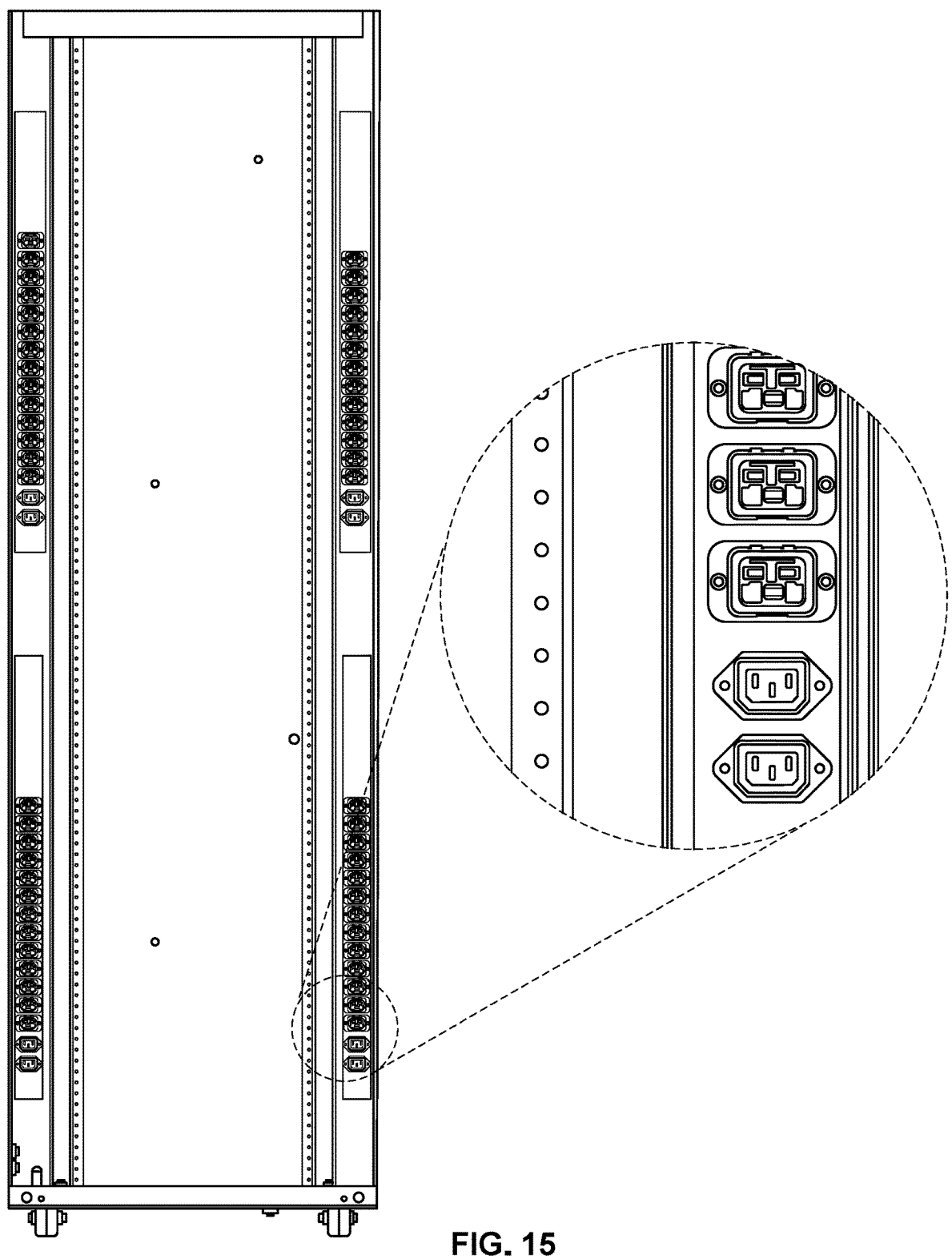
FIG. 15 is a rear view of a server rack according to an embodiment of the present disclosure.

FIG. 15 is a rear view of a server rack according to an embodiment of the present disclosure. As shown, the rack rests on wheels. Plug sockets are provided in the back on the rack along the left side and the right side. An enlarged section of the right panel is also shown in FIG. 15 to better illustrate an example of the plugs that can be used to connect rack components to external components such as an external power source.

FIG. 16 is a front view of a server rack according to an embodiment of the present disclosure. In this example, each of the left side and the right side has a panel for interconnection modules. An enlarged section of the left panel is also shown in FIG. 16 to better illustrate an example of the front of an interconnection module 1630. The interconnection module can be implemented by the techniques disclosed here, e.g., as described in FIG. 5.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system comprising:
   a first group of connectors, wherein each single connector in the first group of connectors provides an interface for a corresponding group of component signal paths;
   a second group of connectors, wherein each single connector in the second group of connectors provides an interface for at least one component signal path from each of the corresponding group of component signal paths of each connector in the first group of connectors; and
   an interconnection enclosure housing at least a portion of the groups of component signal paths connecting the first group of connectors with the second group of connectors;
   wherein a first single connector in the first group of connectors is configured to be coupled to a first port interface module in a first network switch and a second single connector in the first group of connectors is configured to be coupled to a second port interface module in a second network switch to provide an interconnection between network switches.

2. The system of claim 1, wherein the system is configured to provide the interconnection in a mesh network.

3. The system of claim 1, wherein the system is configured to provide the interconnection between a spine switch and other switches in a network.

4. The system of claim 1, wherein the system is configured to provide the interconnection between a fabric switch and other switches in a network.

5. The system of claim 1, wherein the system is configured to provide the interconnection between two different types of switches in a network.

6. The system of claim 1, wherein at least one of the interfaces provided by the first group of connectors includes an optical interface.

7. The system of claim 1, wherein at least one of the interfaces provided by the first group of connectors includes an electrical interface.

8. The system of claim 1, wherein the groups of component signal paths are provided via optical fibers.

9. The system of claim 1, wherein the groups of component signal paths are provided via electrical conductors.

10. The system of claim 1, further comprising a breakout cable coupled to at least one of the first group of connectors.

11. The system of claim 1, wherein twelve connectors are included in the first group of connectors and twelve connectors are included in the second group of connectors.

12. The system of claim 1, wherein the system is configured to be mounted within a network component rack.

13. The system of claim 1, wherein the system is configured to be mounted within a network component rack on a side panel adjacent a network switch.

14. The system of claim 1, wherein:
the first network switch and the second network switch are spine switches;
each single connector in the second group of connectors is configured to be connected to at least one fabric switch of a plurality of fabric switches;
the first single connector in the first group of connectors corresponds to the plurality of fabric switches such that a single network switch is coupled to a plurality of fabric switches via the system.

15. The system of claim 1, wherein a level of redundancy provided by at least one redundant connection between the network switches corresponds to the number of port interface modules in a network switch.

16. The system of claim 1, wherein:
the first group of connectors is provided on a first end of the system;
the second group of connectors is provided on a second end of the system; and
the group of component signal paths is fully enclosed by the interconnection enclosure.

17. A system comprising:
a network component rack; and
a panel coupled to the network component rack and configured to receive an interconnection module, wherein the interconnection module includes:
a first group of connectors, wherein each single connector in the first group of connectors provides an interface for a corresponding group of component signal paths;
a second group of connectors, wherein each single connector in the second group of connectors provides an interface for at least one component signal path from each of the corresponding group of component signal paths of each connector in the first group of connectors; and
an interconnection enclosure housing at least a portion of the groups of component signal paths connecting the first group of connectors with the second group of connectors;
wherein a first single connector in the first group of connectors is configured to be coupled to a first port interface module in a first network switch and a second single connector in the first group of connectors is configured to be coupled to a second port interface module in a second network switch to provide an interconnection between network switches.

18. The system of claim 17, wherein the panel includes an opening for a plurality of vertically arranged interconnection modules.

19. The system of claim 17, further comprising one or more wheels coupled to a bottom of the network component rack.

20. The system of claim 19, further comprising at least leg configured to descend to secure the system from moving via the one or more wheels.

21. The system of claim 17, further comprising at least one power distribution unit configured to deliver power to components in the system.

22. The system of claim 17, further comprising at least one cable support bar coupled to the network component rack and configured to support cabling.

23. A system, comprising:
a first group of network switches at a first layer of a mesh network;
a second group of network switches at a second layer of the mesh network; and
an interconnection module, wherein the interconnection module includes:
a first group of connectors connected to the first group of network switches, wherein each single connector in the first group of connectors provides an interface for a corresponding group of component signal paths;
a second group of connectors connected to the second group of network switches, wherein each single connector in the second group of connectors provides an interface for at least one component signal path from each of the corresponding group of component signal paths of each connector in the first group of connectors;
a first single connector in the first group of connectors is configured to be coupled to a first port interface module in a first network switch and a second single connector in the first group of connectors is configured to be coupled to a second port interface module in a second network switch to provide interconnection between the first group of network switches and the second group of network switches; and
an interconnection enclosure housing at least a portion of the groups of component signal paths connecting the first group of connectors with the second group of connectors.

* * * * *